US011538546B2

(12) United States Patent
Johnson (10) Patent No.: US 11,538,546 B2
(45) Date of Patent: Dec. 27, 2022

(54) DATA COMPRESSION FOR GLOBAL COLUMN REPAIR

(71) Applicant: Micron Technology, Inc., Boise, ID (US)

(72) Inventor: Jason M. Johnson, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 419 days.

(21) Appl. No.: 16/716,366

(22) Filed: Dec. 16, 2019

(65) Prior Publication Data
US 2021/0183461 A1 Jun. 17, 2021

(51) Int. Cl.
G11C 29/38 (2006.01)
G11C 29/44 (2006.01)
G11C 29/54 (2006.01)

(52) U.S. Cl.
CPC ......... G11C 29/38 (2013.01); G11C 29/4401 (2013.01)

(58) Field of Classification Search
None
See application file for complete search history.

(56) References Cited

U.S. PATENT DOCUMENTS

| | | | | |
|---|---|---|---|---|
| 6,158,038 | A * | 12/2000 | Yamawaki | G11B 20/1809 |
| 2004/0085821 | A1* | 5/2004 | Kim | G11C 29/76 |
| | | | | 365/200 |
| 2004/0145661 | A1* | 7/2004 | Murakami | H04N 1/32144 |
| | | | | 348/222.1 |
| 2005/0015541 | A1* | 1/2005 | De Santis | G06F 13/1694 |
| | | | | 711/103 |
| 2006/0259850 | A1* | 11/2006 | Tomisawa | G11B 20/1809 |
| | | | | 714/793 |
| 2010/0070686 | A1* | 3/2010 | Mergler | G06F 11/1068 |
| | | | | 711/E12.001 |
| 2014/0063888 | A1* | 3/2014 | Lee | G11C 11/1653 |
| | | | | 365/163 |
| 2014/0177324 | A1* | 6/2014 | Liu | G11C 8/16 |
| | | | | 365/230.03 |
| 2017/0017395 | A1* | 1/2017 | Kurokawa | G06F 3/0688 |
| 2017/0372799 | A1* | 12/2017 | Bacchus | G11C 29/42 |
| 2018/0068743 | A1* | 3/2018 | Jo | G06F 3/0638 |
| 2019/0324854 | A1* | 10/2019 | Park | G06F 11/1076 |

* cited by examiner

*Primary Examiner* — April Y Blair
*Assistant Examiner* — Dipakkumar B Gandhi
(74) *Attorney, Agent, or Firm* — Holland & Hart LLP (57) ABSTRACT

Methods, systems, and devices for data compression for global column repair are described. In some cases, a testing device may perform a first internal read operation to identify errors associated with on one or more column planes. A value (e.g., a bit) indicating whether an error occurred when testing each column plane may be stored. The testing device may perform a second internal read operation on the same column planes, or on column planes of a different bank of memory cells. The values (e.g., bits) indicating whether errors occurred during the first internal read operation and the values indicating whether errors occurred during the second internal read operation may be combined and stored in a register. The stored values may be read out (e.g., as a burst) to repair the defective column planes.

20 Claims, 7 Drawing Sheets

|     | CP0 505 | CP1 510 | CP2 515 | ... | CPn 520 |     | RD0 525 | RD1 530 | ... | RDn 535 |     | E 540 | O 545 |
| --- | --- | --- | --- | --- | --- | --- | --- | --- | --- | --- | --- | --- | --- |
| Pass 555 | 0 | 0 | 0 |  | 0 |  | 0 | 0 |  | 0 |  | 0 | 0 |
| Single Fail 560 | 1 | 0 | 0 |  | 0 |  | 1 | 0 |  | 0 |  | 1 | 0 |
| Double Fail 565 | 0 | 1 | 1 |  | 0 |  | 0 | 1 |  | 0 |  | 1 | 0 |
| Multiple Fail & Collision 570 | 0 | 1 | 1 |  | 0 |  | 1 | 1 |  | 0 |  | 1 | 1 |
| Two Bank 575 | 0 | 1 | 0 |  | 0 |  | 1 | 0 |  | 1 |  | 1 | 0 |

DATA COMPRESSION FOR GLOBAL COLUMN REPAIR

BACKGROUND

The following relates generally to one or more memory systems and more specifically to data compression for global column repair.

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

DETAILED DESCRIPTION

Designers and manufacturers of memory devices may test aspects of a memory device for electrical defects, such as unintended conduction paths (e.g., shorts or leakages) or disconnects (e.g., opens), for example, for quality control purposes or as part of the design process. Testing for electrical defects may be used to verify or refine device designs or device fabrication processes. Some techniques for testing for electrical defects may use additional storage (e.g., additional memory arrays) for storing the test data.

As the size of arrays of memory cells has increased, the amount of data generated by tests has also increased. The data may be subsequently read out from the test cells in order to determine whether an error associated with the corresponding memory cell occurred. In such a testing configuration, as the size and density of memory arrays grow, the amount of memory of the tester used to conduct the tests may also increase. Furthermore, due to the relatively large amount of data stored in the test cells, the time used to read out the data from the test cells (e.g., the time needed to perform a testing operation) may be undesirably long. Accordingly, it may be desirable to reduce the amount of memory of the tester used during testing procedures for storing data.

A memory system configured to test aspects of a memory device using compressed data is described herein. The memory system may include a plurality of memory cells that are arranged in banks. Each bank may include one or more column planes, and each column plane may include rows and columns of individual memory cells. A column plane may refer to a set of memory cells that may be tested during any one testing operation. During a global column repair operation, data may be read from any column plane. Because a column plane includes multiple memory cells, multiple bits of data may be ordinarily read out from the column plane. However, as described herein, the data may be compressed (e.g., into a single bit of data) that indicates whether an error occurred when testing the associated memory cells. Based on the occurrence of an error, individual column planes may be repaired.

The data read out from a column plane may be stored to a portion of the memory array (e.g., a register). As subsequent column planes are tested, the associated data (e.g., the associated bit of data) may be stored in the register. As the column planes are tested, the associated data may be compressed with data already stored in the register. Accordingly, if a column plane subsequently fails (i.e., if an error occurs in a column plane during a subsequent test), the data stored to the register may be updated. Thus, one bit of data associated with each column plane that indicates the result of a most-recent test may be stored to the register. Due to the compression of data from multiple tests, a relatively small amount of data associated with each column plane may be stored to a memory device. This compression of data may reduce the amount of information communicated to and stored by the tester during a testing operation. Such a reduction in information can decrease the time for performing the testing operation and may reduce the amount of memory used by the tester (and thereby avoid a memory overflow at the tester).

Features of the disclosure are initially described in the context of a memory system and a testing setup as described with reference to FIGS. 1 and 2. Features of the disclosure are described in the context of repair regions of a memory device, and data stored in associated registers as described with reference to FIGS. 3-5. These and other features of the disclosure are further illustrated by and described with reference to an apparatus diagram and a flowchart that relate to data compression for global column repair as described with references to FIGS. 6 and 7.

Figure 1:
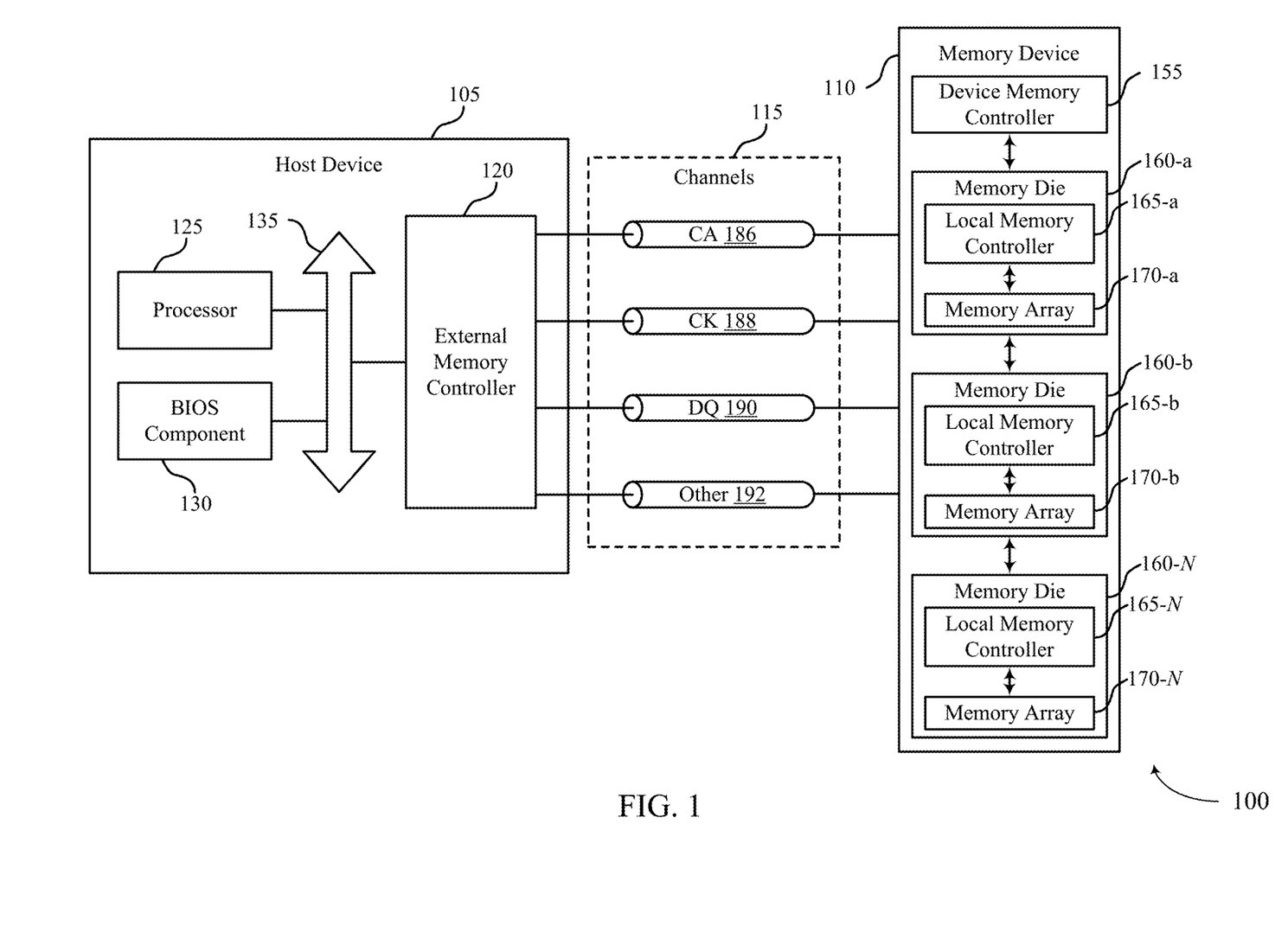
FIG. 1 illustrates an example of a system that supports data compression for global column repair in accordance with examples as disclosed herein.

FIG. 1 illustrates an example of a system 100 that supports data compression for global column repair in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a slave-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of host device may be in coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or a system on a chip (SoC), among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. In some examples, each memory array 170 may include one or more column planes for a testing. When testing a column plane, data associated with the memory cells may be read and compressed (e.g., into a single bit). The compressed data may indicate whether an error occurred during the testing operation.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

The memory device 110 may undergo a testing operation to determine defective memory cells. In some cases, the testing operation may occur as part of a manufacturing process of the memory device 110. During the testing operation, the memory device 110 may be coupled with a tester (e.g., a tester 210 as described with reference to FIG. 2). The tester may test individual column planes of the memory arrays 170 during respective testing operations. When testing a single column plane, data indicating whether an error associated with a respective memory cell occurred may be compressed (e.g., into a single bit). Thus, when testing a column plane, a single bit may be generated that indicates whether any one memory cell within the column plane is defective. The bit (and bits associated with other column planes) may be stored a designated portion of the memory device 110.

The tester may initiate internal read operations that test one or more column planes at a time. The data from each internal read may be stored in a register. In some memory systems, the data from each internal read may be output by the memory device 110 to the tester. To reduce the amount of data communicated to the tester or stored by the tester, the memory device 110 may compress data from multiple internal read operations into a single register and output that compressed to the tester. When doing the compression, some data may be lost, such as if column plane 0 in the first internal read operation and column plane 0 in the second internal read operation both had an error. That is, a bit stored in the register may reflect whether an error associated with a respective column plane index value occurred during any one of the internal read operations. The stored bit may be read out to the tester as part of a command sequence that includes bits associated with testing operations of other column planes. Due to the compression of data from subsequent tests, a relatively small amount of data associated with each column plane may be stored to the memory device 110. Such operations may reduce the amount of data communicated to the tester and stored by the tester (which may mitigate a likelihood that a memory overflow occurs at the tester). Such operations may also reduce the time used to read out the data from the test cells.

Figure 2:
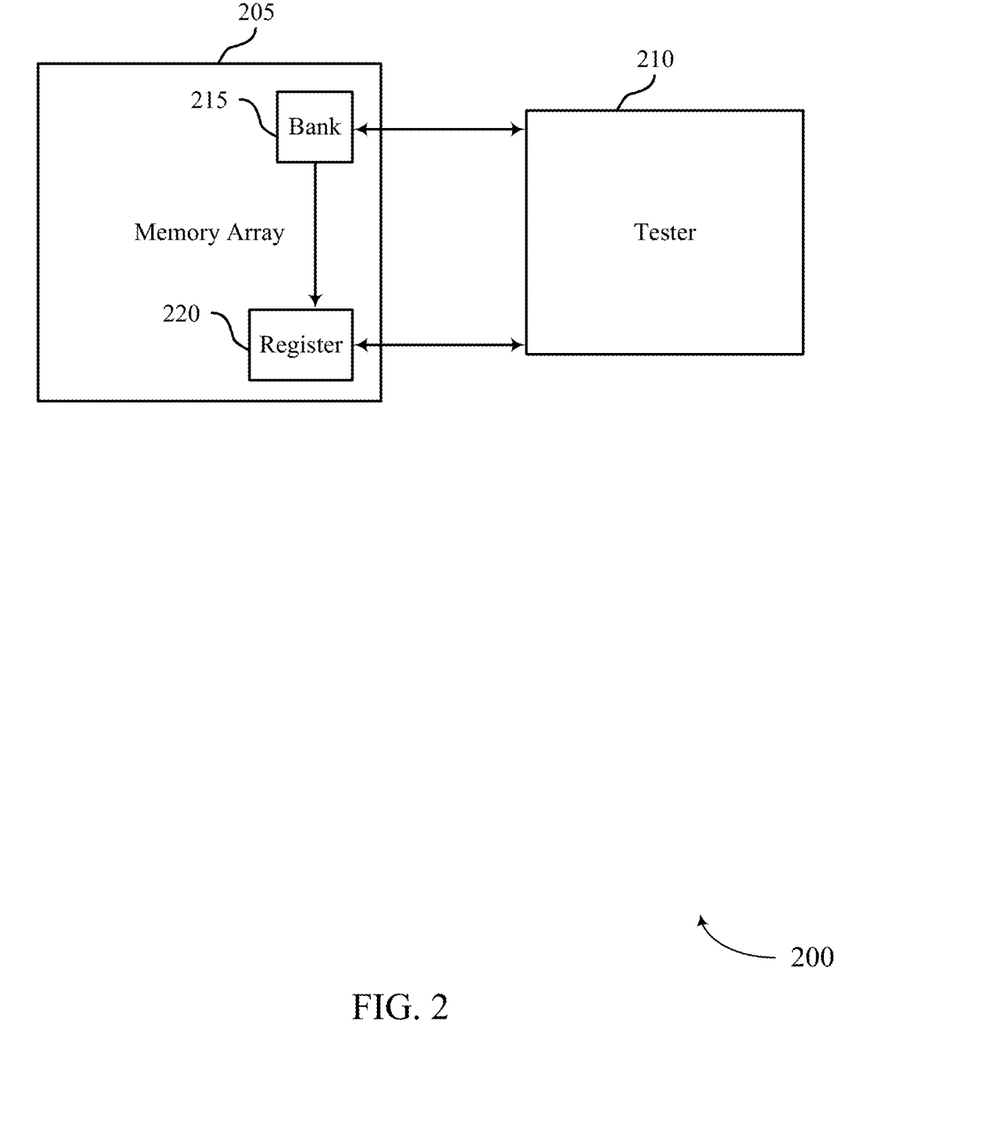
FIG. 2 illustrates an example of a testing setup that supports data compression for global column repair in accordance with examples as disclosed herein.

FIG. 2 illustrates an example of a testing setup 300 that supports data compression for global column repair as disclosed herein. Testing setup 200 may involve a memory die 205 being coupled with a tester 210. The memory die 205 may be an example of a memory die 160 as described with reference to FIG. 1. In some cases, the methods as described herein may be performed during a testing operation of the memory die 205. The data generated during a testing operation may be compressed and stored to a register 220 as a series of bits, which may reduce the number of memory cells designated for storing test data, and may also reduce the time used to read out the data from the test cells. In some examples, memory die 205 may be replaced by a more general logic circuit without deviating from the scope of present disclosure.

Memory die 205 may include one or more memory arrays, which may be subdivided into memory banks, including memory bank 215. The memory bank 215 may contain one or more column planes that each include a different subset of memory cells contained in the one or more memory arrays. Additionally, each memory bank may include one or more access lines (e.g., word lines or bit lines), where each access line is coupled with at least one of the memory cells of the respective subset.

In some examples, the memory bank 215 may be coupled with a register 220. The register 220 may be configured to store test data associated with the memory bank 215. For example, the tester 210 may initiate one or more internal read operations to test one or more column planes of the memory bank 215, and the resulting data may be compressed and/or stored to the register 220. In some examples, multiple column planes may be tested one or more times, and the resulting data may be stored to the register 220. The data may be stored as a series of bits that indicate whether an error occurred during a testing operation of a respective column plane index value. The data stored to the register 220 may be read out (e.g., as a burst) to the tester 210. The tester 210 may then determine how to correct any detected errors. In some examples, the tester 210 may be configured to repair one or more portions of the memory bank 215 using a global repair region.

As the size of memory dies or the density of memory cells goes up, so too does the amount of data that is generated during a testing operation. To analyze test data, the tester 210 may include memory to store the data received from the memory die 205. In some cases, the amount of data generated by a test of a memory die may exceed the memory of the tester 210 such that a memory overflow may occur. In such events, the test may fail and the testing operations may not yield usable data. Techniques for compressing data at the memory die 205 are described to reduce the amount of data communicated to the tester 210 and the amount of data stored by the tester 210. Such techniques may reduce the latency of the testing operation, may reduce a likelihood that a memory overflow occurs at the tester 210, or may yield other advantages.

Figure 3:
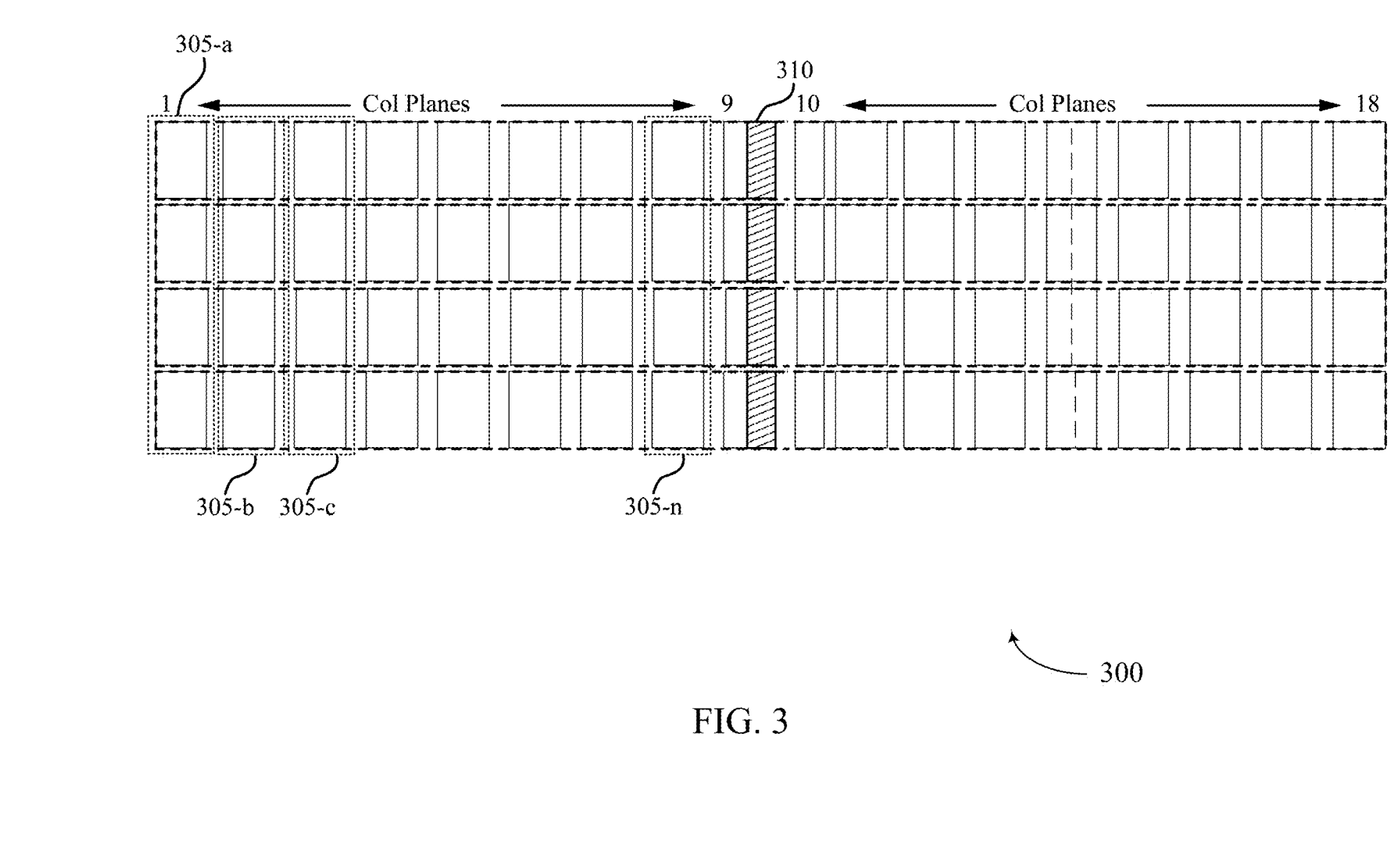
FIG. 3 illustrates an example of a repair region of a memory array that supports data compression for global column repair in accordance with examples as disclosed herein.

FIG. 3 illustrates an example of a repair region 300 of a memory array that supports data compression for global column repair in accordance with examples as disclosed herein. The repair region 300 may include one or more column planes 305 that each include one or more columns of memory cells and a repair column plane 310. For example, the repair region 300 may include column planes 305-a through 305-n, where column 305-n represents an Nth column plane of the repair region 300. The repair column plane 310 may comprise one or more column that can be used to replace fault columns in the other column planes 305 of the repair region 300. For example, if column 2 of column plane 3 (e.g., column plane 305-c) of the repair region 300 is determined to be faulty, the address for this fault column may be redirected to a column of the repair column plane 310.

In some examples, the column planes 305 may be repaired during a testing process that uses a memory (e.g., fail memory of the tester) designated to store identifications of errors associated with the repair region 300. The errors associated with the repair region 300 may be identified using OR logic (e.g., one or more OR gates), which may reduce an amount of data output from the memory array and also reduce the amount of fail memory needed to identify errors associated with each of the column planes 305 of the repair region 300.

The repair region 300 may include column planes 305-a through 305-n, and each column plane (CP) may include one or more rows and/or columns of memory cells. For example, the repair region 300 may include thirty four (34) column planes 305 that each include one or more rows and/or columns of memory cells. That is, a memory array may include one or more banks that include one or more repair regions, such as repair region 300. When an error associated with a column plane 305 is identified, an indication may be stored that may allow for the defective column plane 305 to be fixed or replaced by a column of the repair column plane 310 in the repair region 300. In some examples, each column plane 305 may be located on a same memory die as the fail memory.

In some examples, the repair region 300 may be one of several repair regions within a bank of the memory array. That is, a memory array may include multiple banks, and each bank may include one or more repair regions, such as repair region 300. Techniques are described for performing internal read operations as part of a testing operation on multiple repair regions. The data from each internal read operation may be compressed into a single sets of data output to the testing device. In some cases, similar errors may occur in similar areas of a memory die (e.g., more errors may occur in repair regions close to an edge of a memory die). To reduce likelihoods of data being lost due to the compression of the data, a testing operation may include an internal read operation pattern that interleaves banks (i.e., alternating read operations between banks), which may result in errors that are local to a particular column plane 305 being more readily detectable.

During a testing phase of manufacturing, an internal read operation may be applied to one or more column planes 305 to determine whether an error occurred. Error data for each column plane in the internal read may be stored to a register. For example, an internal read operation may test 34 column planes for errors and the associated register may have at least 34 bit locations to store error data for each column plane tested as part of the internal read operation. Each column plane 305 may include multiple memory cells, each of which can be associated with an error. Thus a relatively large quantity of data may be read from any one column plane 305. To minimize the amount of data stored to the fail memory of the tester, the data read out from each column plane 305 may be compressed to a single bit using one or more compression schemes. The compressed data may indicate, for example, whether an error occurred when testing the column plane 305. For example, the compressed bit may be a logic value "1" if an error occurred when testing the column plane 305, and a logic value "0" if no errors occurred when testing the column plane 305. The logic value may be stored in register of the memory device before being output to the tester.

Rather than sending out data after each internal read operations, multiple read operations may be performed and stored in the register before being output to the tester. The error data from the second internal read may be stored in the same register as that the first internal read operation. For example, when storing the error data in the register the value stored in the register (e.g., the error data associated with the first read operation) may be OR'ed with the data from the second internal read operation. In this manner, the data from both the first internal read operation and the second internal read operation may be compressed into a single register before being output to the tester.

After one or more internal read operations are performed, the data stored to the register may be read out. This may be referred to as a read-out or a read-out operation. The data may be read out as a single command sequence (i.e., a single burst) and may be read to a device coupled with the memory array, such as a test device (e.g., a tester). The command sequence may include multiple bits that indicate, for example, whether a particular column plane 305 experienced an error and/or whether any errors associated with the column planes 305 occurred during a particular internal read, among other things. The read-out operation may facilitate the repair of one or more faulty column planes 305. For example, the tester may use the data read out from the memory device to determine what column of a repair column plane 310 is used to replace what fault column of the one or more column planes 305 of the repair region 300.

Figure 4:
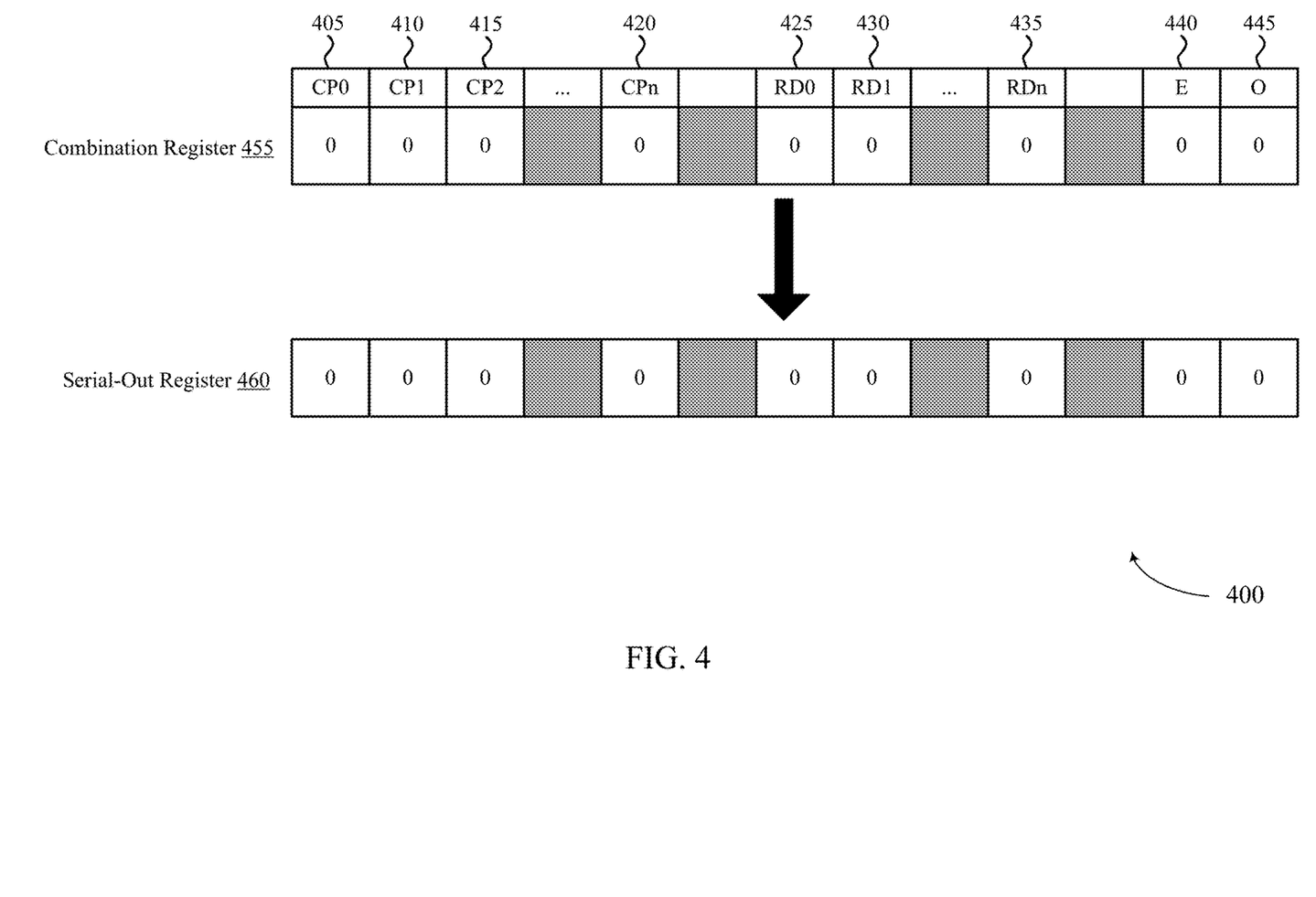
FIG. 4 illustrates example registers of a memory device that support data compression for global column repair in accordance with examples as disclosed herein.

FIG. 4 illustrates example registers 400 of a memory device that support data compression for global column repair in accordance with examples as disclosed herein. The registers 400 may include a combination register 455 and a serial-out register 460. Each register 400 may include storage for logic values that indicate whether a particular column plane (e.g., a column plane 305 as described with reference to FIG. 3) experienced an error, whether any errors associated with the column planes occurred during a particular internal read, and whether an error was associated with an even and/or odd addresses. Logic values associated with internal read operations of a memory array may be stored to the combination register 455 and may be moved (e.g., transferred) to the serial-out register 460 to be read out as a single burst (e.g., to a test device).

The combination register 455 may correspond to a portion of a memory array. In particular, the combination register 455 may be associated with the column planes 305 of the repair region 300 as described with reference to FIG. 3. For example, CP0 405 may store a logic value that indicates whether an error occurred during an internal read of the column plane 305-a of an internal read operation. Similarly, CP1 410 and CP2 415 may store respective logic values that indicate whether errors occurred during an internal read of column plane 305-b and column plane 305-c.

The combination register 455 may include storage up to and including CPn 420, which stores an indication of whether an error occurred during an internal read of an Nth column plane (column plane 305-n) as described with reference to FIG. 3. For example, if an internal read operation can test 34 column planes at once, the combination register 455 may include 34 bit locations to store error data for each column plane tested as part of a single internal read operation. In some examples, the Nth column plane may represent a final column plane within the repair region 300 (e.g., the 34th column plane of the repair region 300). Error data from multiple internal read operations may be compressed into the combination register 455.

The combination register 455 may also store a logic value that indicates whether an error occurred during a particular internal read operation. For example, RD0 425 may store a logic value that indicates whether an error occurred during a first internal read operation of a repair region. Similarly, RD1 may store a logic value that indicates whether an error occurred during a second internal read operation of a repair region (either a different repair region as the first internal read or the same repair region). The combination register 455 may include storage up to and including RDn 435, which store an indication of whether an error occurred during an Nth internal read of the repair region 300 as described with reference to FIG. 3. In some examples, a quantity of internal read operations (e.g., up to eight (8) internal read operations) may occur before the data is transferred to the serial-out register 460. The quantity of internal read operations that can be compressed into a single read-out command may be related to the quantity of bit locations in the register 455 configured to store whether a particular internal read operation included an error. From the error data about the column planes and the error data about the internal read operations, the tester may be able to reconstruct what column planes had errors and may determine how to repair such column planes. In some cases, bit locations in the register 455 may be referred to as bit indexes.

An example of how the compression scheme may work may include Or'ing bits as they are input into the combination register 455. The memory device may perform a first internal read operation of a first repair region. Error data for each column plane in that repair region may be stored in the column plane bit locations in the combination register 455. For example, if no errors occur in the first internal read operation, then the bit locations (e.g., CPn 405-420) for the column planes may all be logic "0s" and the bit location for the first internal read operation (e.g. RD0 425) may also be a logic "0". The memory device may perform a second internal read operation of a second repair region. Error data for each column plane in the second repair region may be Or'ed with the data already stored in the combination register 455 and then that resulting data may be stored in the combination register 455. For example, if no errors occur in the second internal read operation, then the bit locations (e.g., CPn 405-420) for the column planes may all be logic "0s" after the Or'ing and the bit location for the second internal read operation (e.g. RD1 430) may also be a logic "0". If an error does occur in the second internal read operation, however, at least one of the column plane bit locations will include a logic "1" and the internal read operation bit location (e.g., RD1 430) may also include a logic "1".

The combination register 455 may store logic values that indicate whether an error associated with an even and/or odd address occurred. For example, if an error that is associated with an even address (e.g., an even gap) of the repair region 300 occurs, E 440 may store the logic value "1". Similarly, if an error that is associated with an odd address (e.g., an odd gap) of the repair region 300 occurs, O 445 may store the logic value "1". If an error associated with an even and/or an odd address does not occur, E 440 and/or O 445 may store the logic value "0". By storing an indication in the combination register 455 of whether an error occurred in an even and/or odd gap, additional information about where errors occur may be ascertained.

During a first internal read operation, logic values that indicate whether an error occurred during an internal read of each column plane may be stored to the combination register 455. For example, no errors may be determined during a first internal read and a logic value "0" may be stored to each of CP0 405, CP1 410, CP2 415, and CPn 420. Similarly, a logic value "0" may be stored to RD0 425 to indicate that no errors were detected during the first internal read operation.

During subsequent internal read operations, logic values associated with each of CP0 405, CP1 410, CP2 415, and CPn 420 may be compared with the values stored in the combination register 455 before being stored. Particularly, OR logic (e.g., an OR gate) may be used when comparing the logic values. For example, during a second internal read operation, an error associated with a first column plane of the first repair region may be determined. An associated logic value "1" (indicating that an error occurred) may be compared with the logic value "0" stored to CP0 405 of the combination register 455. Because the logic values may be compared using OR logic, the logic value stored to CP0 405 may be updated to store the logic value "1". That is, the logic value "0" may be overwritten with a logic value "1" due to the occurrence of the error associated with the corresponding column plane. In this example, a logic value "1" may be stored to RD1 430 to indicate that an error was detected during the second internal read operation. The use of OR logic when storing logic values to the combination register 455 may reduce the amount of fail memory at the tester needed to identify errors associated with each of the column planes of a repair region.

In some examples, logic values may be stored to the combination register 455 as part of a bank interleave operation. Sometimes errors on memory devices may occur in similar locations on the memory die. For example, more errors are likely to occur near an edge of a die than in a middle of a die. With the data compression scheme described herein, a data collision may occur when information is lost due to the data compression. For example, if a column plane that is indexed as CP0 in multiple internal read operations includes an error, the tester may not be able to determine whether CP0 associated with the first internal read operation failed or whether CP0 of a different internal read operation failed. To reduce the likelihood that the same column planes fail during the same compression of data, the repair regions tested by successive internal read operations may be interleaved between banks or interleaved between different locations on the memory die. In other examples, when a memory cell within a column plane experiences an error, there is an increased likelihood that the error affects surrounding memory cells. When the error affects surrounding memory cells, column planes may be incorrectly indicated as faulty, which may lead to the column plane being unnecessarily repaired (i.e., over repaired). To minimize over repair, column planes may be tested by alternating (e.g., interleaving) banks.

When interleaving banks, a first bank may be selected for a first internal read operation and a second bank (e.g., a different bank) may be selected for a second internal read operation. That is, the column planes of a first bank may be read during a first internal read operation, and column planes of a second bank may be read during a second (e.g., a subsequent) internal read operation. Because similar errors associated with a same column plane of different banks (e.g., a first column plane of a first bank and a first column plane of a second bank) are unlikely, localized errors may be more discernible in the compressed data by interleaving banks. That is, instances where column planes are incorrectly identified as faulty may be isolated to a particular bank and/or a particular column plane, which may reduce the amount of times any one column plane is unnecessarily repaired.

In some examples, the data stored to the combination register 455 may be read out (e.g., transferred) to the serial-out register 460 based on an occurrence of an event. For example, the data may be transferred after a predefined number of internal read operations, or the data may be transferred based on the associated memory device receiving a command (e.g., a read-out command) from an external device such as a test device. The data may be transferred from the combination register 455 to the serial-out register 460 via one or more buses. Once the data is stored to the serial-out register 460, the data can be serially read out (e.g., to an external device such as a test device).

When data is read out from the serial-out register 460, it can be read out as a single command sequence (e.g., as a single burst). The command sequence could be, for example, forty eight (48) bits of data that indicate whether errors associated with particular column planes occurred, whether errors associated with particular internal read operations occurred, and the like. Thus the size of the data read out may be dependent upon a number of number of internal operations and/or the number of column planes being examined in each read. In other examples, the sequence could be fifty six (56) bits. The additional eight (8) bits could be associated with additional data compression. In either example, the data could be read out (from the serial-out register 460) serially.

In other examples, a read-modify-write (RMW) operation may occur. During a RMW operation, every time a read command is received, a subset of the bits stored to the serial-out register 460 may be read out. For example, when a read command is received, eight (8) bits may be read out from the serial-out register 460. As additional read commands are received, the additional bits stored to the serial-out register 460 may be read out. A RMW operation may be implemented as a matter of design choice to save time that would otherwise be dedicated to reading out all of the bits (e.g., all forty eight (48) bits) from the serial-out register 460.

By way of example, a first compression operation is described where up to twelve (12) internal read operations are compressed into a single read-out operation. In some examples, it may be desirable for eight (8) banks of memory cells to each be internally read using DDR. Each internal read operation may include thirty four (34) column planes (or 17 column planes that are each read twice for redundancy purposes). In some examples, the compression scheme used for reading the banks of memory cells may allow for data to be read out from the banks in eight (8) bit bursts. Accordingly, the command sequence saved to the combination register 455 and transferred to the serial-out register 460 may be forty eight (48) bits (e.g., bits <0:33> may be for error data for individual column planes, bits <34:45> may be for error data associated with internal read operations, and bits <46:47> may be for even/odd error data).

Of the forty eight (48) bits, the first thirty four (34) bits may be reserved for storing an indication of whether an error occurred during an internal read of a respective column plane, and two (2) bits may be reserved for storing an indication of whether an error associated with an even and/or odd address occurred. Thus, twelve (12) bits remain and can be used to indicate whether an error occurred in a particular internal read operation. That is, the eight (8) banks of memory cells may be read up to a total of twelve (12) times. The forty eight (48) bits may be transferred from the combination register 455 to the serial-out register 460, where they may be read out (e.g., to a test device).

By way of example, a second compression operation is described where up to twenty (20) internal read operations are compressed into a single read-out operation. In some examples, it may be desirable for sixteen (16) banks of memory cells to each be internally read seven (7) times using DDR. Each internal read operation may include thirty four (34) column planes (or 17 column planes that are each read twice for redundancy purposes). In some examples, the compression scheme used for reading the banks of memory cells may allow for data to be read out from the banks in eight (8) bit bursts. Accordingly, the command sequence saved to the combination register 455 and transferred to the serial-out register 460 may be fifty six (56) bits (e.g., bits <0:33> may be for error data for individual column planes, bits <34:53> may be for error data associated with internal read operations, and bits <54:55> may be for even/odd error data).).

Of the fifty six (56) bits, the first thirty four (34) bits may be reserved for storing an indication of whether an error occurred during an internal read of a respective column plane, and two (2) bits may be reserved for storing an indication of whether an error associated with an even and/or odd address occurred. Thus, twenty (20) bits remain and can be used to indicate whether an error occurred in a particular internal read operation. That is, the sixteen (16) banks of memory cells may be read up to a total of twenty (20) times. The fifty six (56) bits may be transferred from the combination register 455 to the serial-out register 460, where they may be read out (e.g., to a test device).

By way of example, a third compression operation is described where up to twenty (20) internal read operations are compressed into a single read-out operation. In some examples, it may be desirable for sixteen (16) banks of memory cells to each be internally read fourteen (14) times using SDR. Each internal read operation may include thirty four (34) column planes (or 17 column planes that are each read twice for redundancy purposes). In some examples, the compression scheme used for reading the banks of memory cells may allow for data to be read out from the banks in two (2) bit bursts (i.e., four (4) bit bursts when converting to DDR). Accordingly, the command sequence saved to the combination register 455 and transferred to the serial-out register 460 may be fifty six (56) bits (e.g., bits <0:33> may be for error data for individual column planes, bits <34:53> may be for error data associated with internal read operations, and bits <54:55> may be for even/odd error data).).

Of the fifty six (56) bits, the first thirty four (34) bits may be reserved for storing an indication of whether an error occurred during an internal read of a respective column plane, and two (2) bits may be reserved for storing an indication of whether an error associated with an even and/or odd address occurred. Thus, twenty (20) bits remain and can be used to indicate whether an error occurred in a particular internal read operation. That is, up to a total of twenty (20) reads may be performed on the banks of memory cells (e.g., the fourteen (14) banks of memory cells). The fifty six (56) bits may be transferred from the combination register 455 to the serial-out register 460, where they may be read out (e.g., to a test device).

Figure 5:
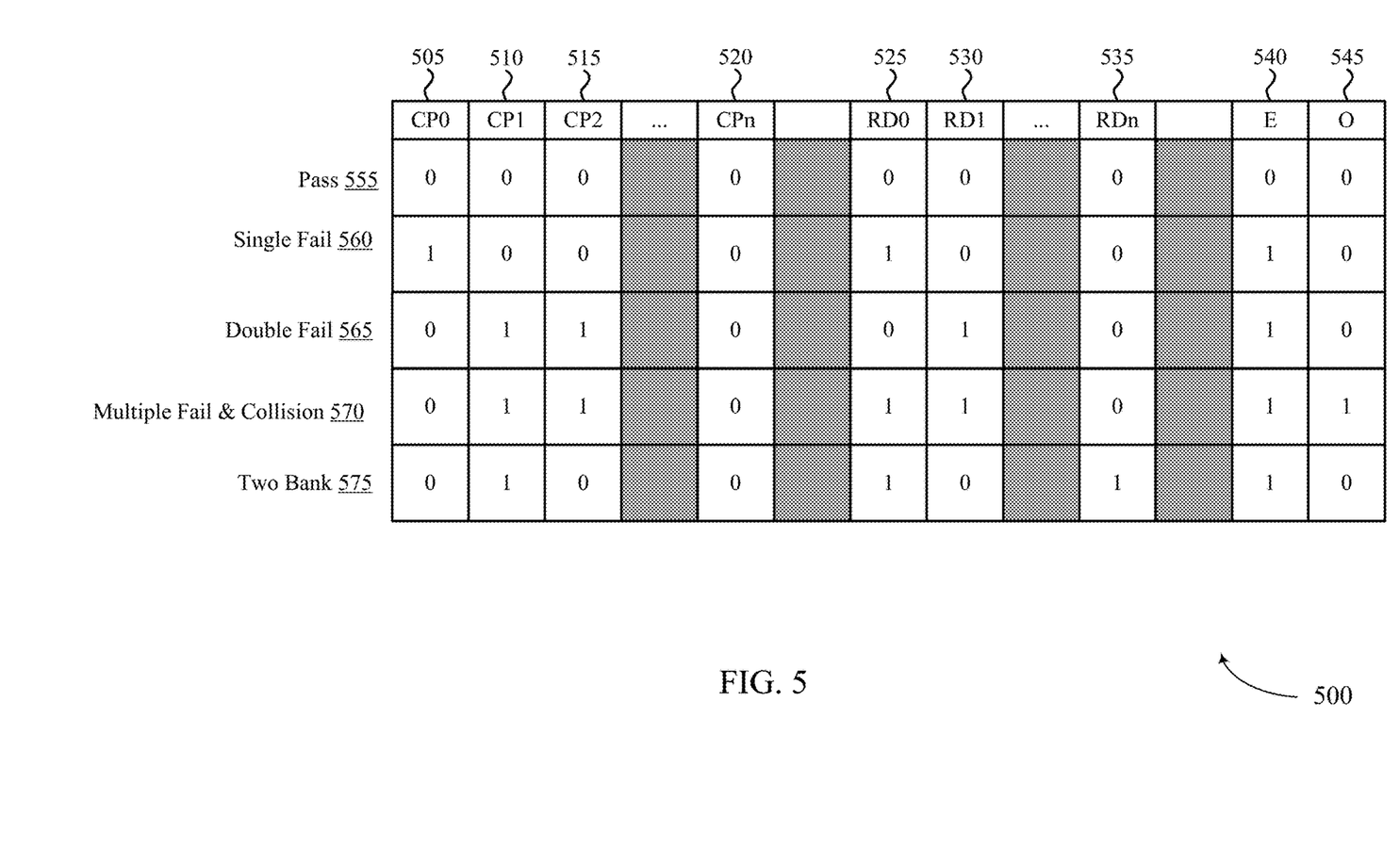
FIG. 5 illustrates example data stored to a register of a memory device that support data compression for global column repair in accordance with examples as disclosed herein.

FIG. 5 illustrates example data 500 stored to a register of a memory device that support data compression for global column repair in accordance with examples as disclosed herein. The register may be an example of a combination register 455 or a serial-out register 460 as described with reference to FIG. 4. The register may include storage for logic values that indicate whether a particular column plane (e.g., a column plane 305 as described with reference to FIG. 3) experienced an error, whether any errors associated with the column planes occurred during a particular internal read, and whether an error was associated with an even and/or odd addresses. The stored logic values may be stored to a combination register (e.g., the combination register 455 as described with reference to FIG. 4) and may be moved (e.g., transferred) to a serial-out register (e.g., a serial-out register 460 as described with reference to FIG. 4) for being read out as a single burst (e.g., to a test device).

In some examples, the data 500 may illustrate various results of a compression operation that includes a plurality of internal read operations. The register that stores the data 500 may be associated with the column planes 305 of the repair region 300 as described with reference to FIG. 3. For example, CP0 505 may store a logic value that indicates whether an error occurred during an internal read of the column plane 305-a. Similarly, CP1 510 and CP2 515 may store respective logic values that indicate whether errors occurred during an internal read of column plane 305-b and column plane 305-c. The register may include storage up to and including CPn 520, which store an indication of whether an error occurred during an internal read of an Nth column plane (column plane 320-n) as described with reference to FIG. 3.

The register may also store a logic value that indicates whether an error occurred during a particular internal read operation. For example, RD0 525 may store a logic value that indicates whether an error occurred during a first internal read of the repair region 300. Similarly, RD1 530 may store a logic value that indicates whether an error occurred during an internal read of column plane 305-b. The combination register 455 may include storage up to and including RDn 535, which store an indication of whether an error occurred during an Nth internal read of the repair region 300 as described with reference to FIG. 3. The register may also store logic values that indicate whether an error associated with an even and/or odd address occurred. For example, if an error that is associated with an even address (e.g., an even gap) of the repair region 300 occurs, E 540 may store the logic value "1". Similarly, if an error that is associated with an odd address (e.g., an odd gap) of the repair region 300 occurs, O 545 may store the logic value "1". If an error associated with an even and/or an odd address does not occur, E 540 and/or O 545 may store the logic value "0".

In some examples, a plurality of internal read operations of column planes may result in a pass 555. That is, no errors may be identified when performing each internal read of each column plane. Accordingly, each of CP0 505 through CPn 520 may store a logic value "0", each of RD0 525 through RDn 535 may store a logic value "0", and each of E 540 and O 545 may store a logic value "0". These values may be read out (e.g., to a test device) as a single command sequence. The tester may be configured to determine that no column planes in the compressed data should be repaired based on the pass 555.

In some examples, a plurality of internal read operations of column planes may result in a single fail 560. That is, a single error may be identified during a single internal read operation of the plurality of internal read operation compressed into the single set of data. For example, the error may be associated with a first column plane and may occur during a first internal read operation. Accordingly, CP0 505 may store a logic value "1", RD0 525 may store a logic value "1", and E 540 may store a logic value "1". All other values stored in the register may be a logic "0". These values may be read out (e.g., to a test device) as a single command sequence. The tester may be configured to determine what column plane needs to be repaired based on which CPn bit is set to a logic "1" and which RDn bit is set to a logic "1". In some cases, the tester may use prior information about the mapping of the internal read operations to determine what column plane failed.

In some examples, a plurality of internal read operations of column planes may result in a double fail 565. That is, two errors may be identified during a single internal read operation of the compressed data. For example, the errors may be associated with a second column plane and a third column plane, and may occur during a second internal read operation. Accordingly, CP1 510 may store a logic value "1", CP2 515 may store a logic value "1", RD1 525 may store a logic value "1", and E 540 may store a logic value "1". All other values stored in the register may be a logic "0". These values may be read out (e.g., to a test device) as a single command sequence. The tester may be configured to determine what column plane needs to be repaired based on which CPn bits are set to a logic "1" and which RDn bit is set to a logic "1". In some cases, the tester may use prior information about the mapping of the internal read operations to determine what column plane failed.

In some examples, a plurality of internal read operations of column planes may result in multiple fails and data collision 570. Data collisions may occur when multiple fails occur during different internal reads (or during internal reads of different banks), and may result in one or more column planes being over repaired. Data collisions refer to situations where the compression of the data from the plurality of internal read operations causes information to be lost and the tester cannot reliably determine what column plane should be repaired. To minimize collisions, column and/or row fails of particular column planes may be identified. The column and/or row fails may be identified using circuitry, such as the repair analyzer (RA) described herein.

An internal read operation resulting in multiple data fails and data collision 570 may be identified during an internal read operation of two different banks. For example, the error may be associated with a second column plane and a third column plane, and may occur during a first internal read operation of a first bank and a second internal read operation of a second bank. Thus, without determining which columns and/or rows of the column planes fail, it may not be possible to determine which internal reads resulted in which errors. For example, CP1 510 may store a logic value "1", CP2 515 may store a logic value "1", RD0 525 may store a logic value "1", RD1 530 may store a logic value "1", E 540 may store a logic value "1", and O 545 may store a logic value "1". Accordingly, the RA may identify a potential data collision based on the data 500 stored in the register, and may identify particular column and/or rows to be repaired to avoid over repair of any one column plane. The tester may be configured to determine that a collisions occurs based on which CPn bit(s) is set to a logic "1" and which RDn bit(s) is set to a logic "1".

In some examples, a plurality of internal read operations of column planes may result in failures in two banks 575 at the same bit index value. That is, an error associated with a same column plane bit index may be identified during a first internal read operation of a first bank or repair region and an error may be identified during a second internal read operation of a second bank or repair region. For example, the error may be associated with a second column plane and may occur during a first internal read operation of a first bank and a second internal read operation of a second bank. Accordingly, CP1 510 may store a logic value "1", RD0 525 may store a logic value "1", RD1 530 may store a logic value "1", and E 540 may store a logic value "1". All other values stored in the register may be a logic "0". These values may be read out (e.g., to a test device) as a single command sequence. The tester may be configured to determine what column planes need to be repaired based on which CPn bit is set to a logic "1" and which RDn bits are set to a logic "1". In some cases, the tester may use prior information about the mapping of the internal read operations to determine what column plane failed.

Figure 6:
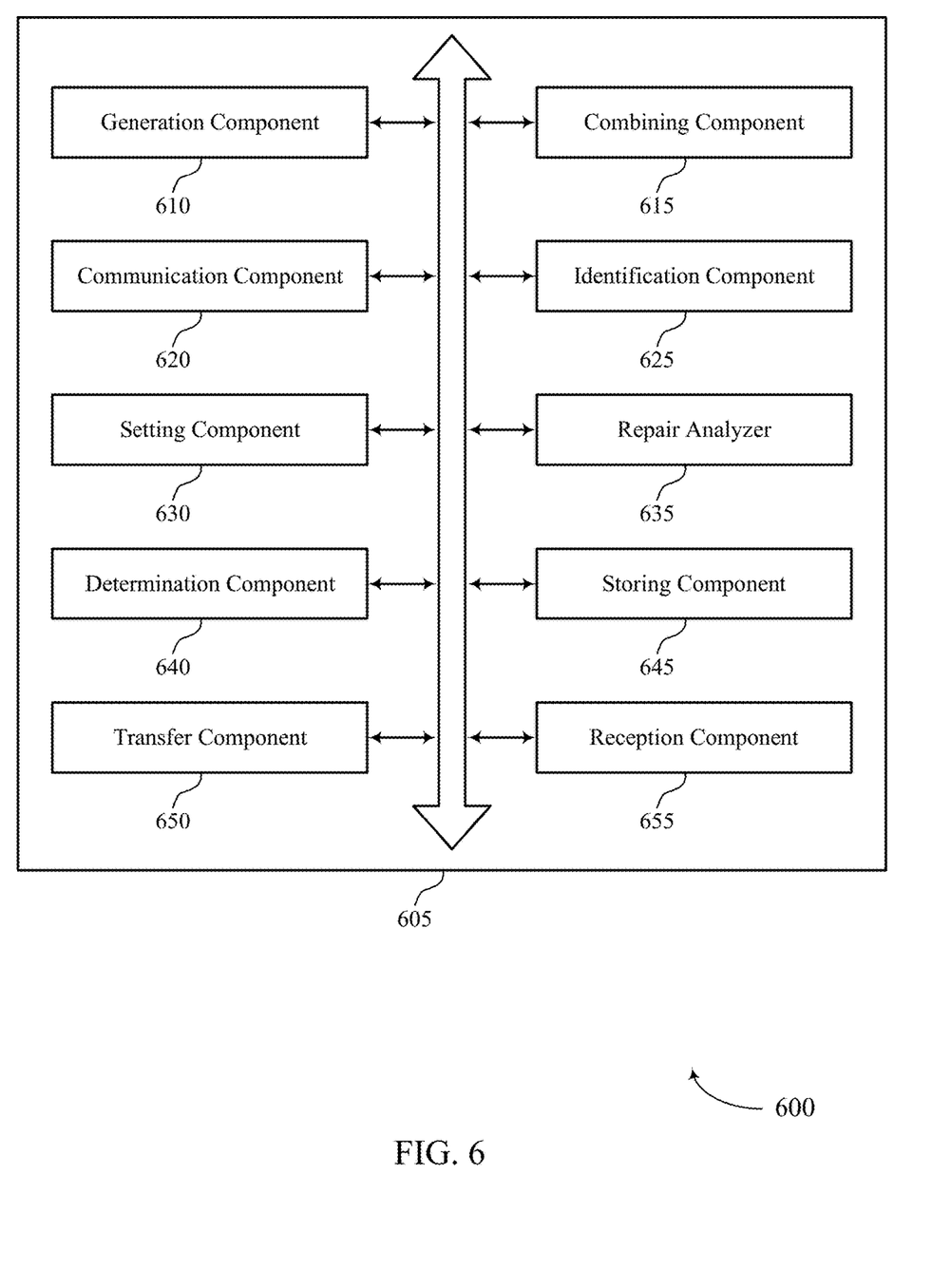
FIG. 6 shows a block diagram of a memory device that supports data compression for global column repair in accordance with examples as disclosed herein.

FIG. 6 shows a block diagram 600 of a memory device 605 that supports data compression for global column repair in accordance with examples as disclosed herein. The memory device 605 may be an example of aspects of a memory device as described with reference to FIGS. 3 through 5. The memory device 605 may include a generation component 610, a combining component 615, a communication component 620, an identification component 625, a setting component 630, a repair analyzer 635, a determination component 640, a storing component 645, a transfer component 650, and a reception component 655. Each of these modules may communicate, directly or indirectly, with one another (e.g., via one or more buses).

The generation component 610 may generate, using a first read operation, first data to identify one or more errors associated with memory cells of a first set of column planes of a memory device, the first data including a first set of indicators about whether each column plane of the first set of column planes includes the one or more errors. In some examples, the generation component 610 may generate, using a second read operation, second data to identify one or more errors associated with memory cells of a second set of column planes of the memory device, the second data including a second set of indicators about whether each column plane of the second set of column planes includes the one or more errors.

In some examples, the generation component 610 may generate, for each read operation performed, an indicator about whether one or more errors were identified during a respective read operation, where the message includes the indicator for each read operation. In some examples, the generation component 610 may generate a value for the first bit index of the third data based on the first bit of the first data being the first value or the second bit of the second data being the first value.

The combining component 615 may combine the first data and the second data into a third data that includes a third set of indicators about whether the first set of column planes and the second set of column planes include one or more errors.

The communication component 620 may communicate, by the memory device, a message that includes the third data formed by combining the first data and the second data.

The identification component 625 may identify that a first column plane of the first set of column planes or the second set of column planes includes an error based on the third data formed by combining the first data and the second data and the indicators about whether the one or more are associated with respective read operations. In some examples, the identification component 625 may identify that a first bit of the first data at a first bit index is a first value. In some examples, the identification component 625 may identify that a second bit of the second data at the first bit index is the first value.

In some examples, the identification component 625 may identify a collision associated with the first data and the second data based on the value of the first bit, the second bit, the third bit, and the fourth bit. In some examples, the identification component 625 may identify one or more banks for the first read operation and one or more banks for the second read operation according to a bank interleave pattern operable to reduce a likelihood of errors occurring for similar bit indexes values of the first data and the second data, where generating the first data and the second data is based on identifying the one or more banks for the first read operation and the second read operation.

The setting component 630 may set a value of a third bit to indicate whether the one or more errors are associated with the first read operation. In some examples, the setting component 630 may set a value of a fourth bit to indicate whether the one or more errors are associated with the second read operation.

The repair analyzer 635 may perform a single repair operation on the first set of column planes, the second set of column planes, or both based on identifying the collision associated with the first data and the second data. In some examples, the repair analyzer 635 may repair the column plane at the address based on determining the address. In some examples, the repair analyzer 635 may be located external to the memory device 605. For example, the repair analyzer 635 may be included on a tester (e.g., tester 210 as described with reference to FIG. 2) and may communicate with the memory device 605.

The determination component 640 may determine an address of a column plane associated with the one or more errors based on communicating the message.

The storing component 645 may store the first data and the second data to a first register, where combining the first data with the second data occurs at the first register.

The transfer component 650 may transfer the third data to a second register different than the first register, where the third data is communicated from the second register.

The reception component 655 may receive a read-out command, where communicating the message is based on receiving the read-out command.

Figure 7:
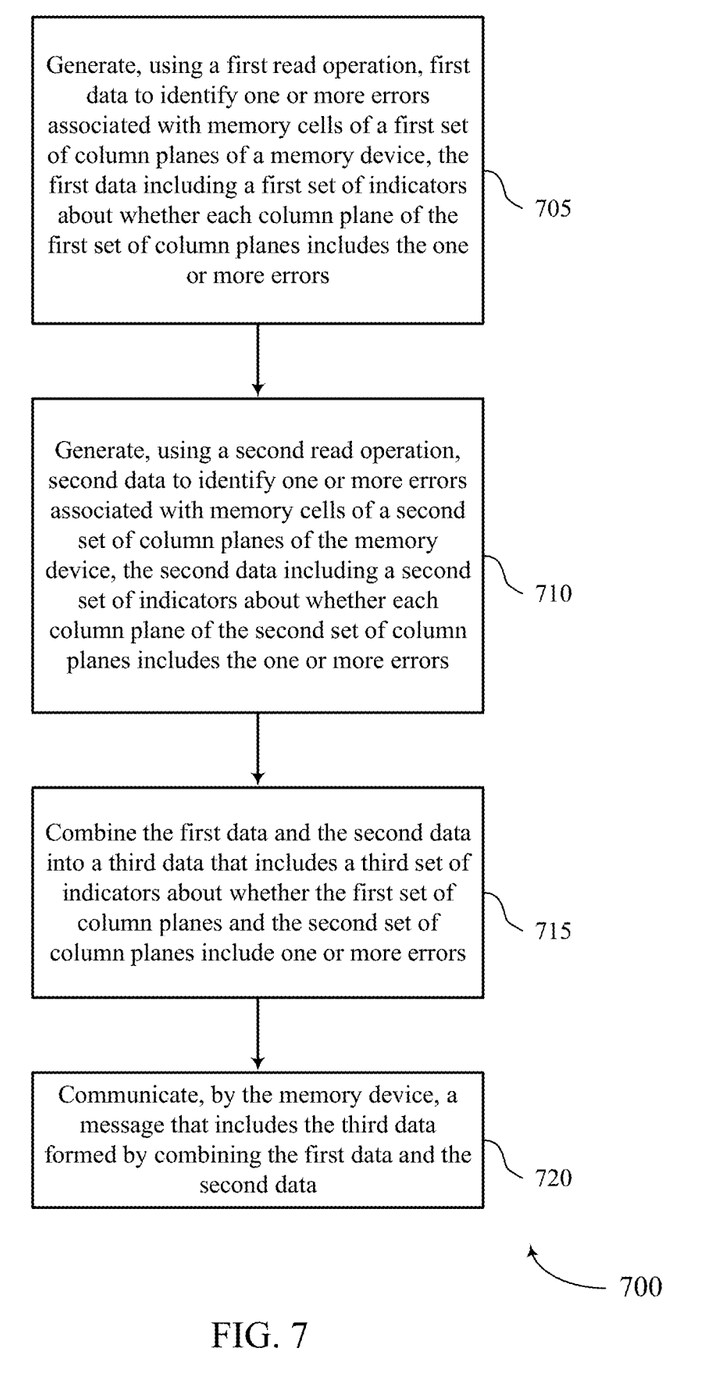
FIG. 7 shows a flowchart illustrating a method or methods that support data compression for global column repair in accordance with examples as disclosed herein.

FIG. 7 shows a flowchart illustrating a method or methods 700 that supports data compression for global column repair in accordance with examples as disclosed herein. The operations of method 700 may be implemented by a memory device or its components as described herein. For example, the operations of method 700 may be performed by a memory device as described with reference to FIG. 6. In some examples, a memory device may execute a set of instructions to control the functional elements of the memory device to perform the described functions. Additionally or alternatively, a memory device may perform aspects of the described functions using special-purpose hardware (such as a tester coupled with the memory device).

At 705, the memory device may generate, using a first read operation, first data to identify one or more errors associated with memory cells of a first set of column planes of a memory device, the first data including a first set of indicators about whether each column plane of the first set of column planes includes the one or more errors. The operations of 705 may be performed according to the methods described herein. In some examples, aspects of the operations of 705 may be performed by a generation component as described with reference to FIG. 6.

At 710, the memory device may generate, using a second read operation, second data to identify one or more errors associated with memory cells of a second set of column planes of the memory device, the second data including a second set of indicators about whether each column plane of the second set of column planes includes the one or more errors. The operations of 710 may be performed according to the methods described herein. In some examples, aspects of the operations of 710 may be performed by a generation component as described with reference to FIG. 6.

At 715, the memory device may combine the first data and the second data into a third data that includes a third set of indicators about whether the first set of column planes and the second set of column planes include one or more errors. The operations of 715 may be performed according to the methods described herein. In some examples, aspects of the operations of 715 may be performed by a combining component as described with reference to FIG. 6.

At 720, the memory device may communicate, by the memory device, a message that includes the third data formed by combining the first data and the second data. The operations of 720 may be performed according to the methods described herein. In some examples, aspects of the operations of 720 may be performed by a communication component as described with reference to FIG. 6.

In some examples, an apparatus as described herein may perform a method or methods, such as the method 700. The apparatus may include features, means, or instructions (e.g., a non-transitory computer-readable medium storing instructions executable by a processor) for generating, using a first read operation, first data to identify one or more errors associated with memory cells of a first set of column planes of a memory device, the first data including a first set of indicators about whether each column plane of the first set of column planes includes the one or more errors, generating, using a second read operation, second data to identify one or more errors associated with memory cells of a second set of column planes of the memory device, the second data including a second set of indicators about whether each column plane of the second set of column planes includes the one or more errors, combining the first data and the second data into a third data that includes a third set of indicators about whether the first set of column planes and the second set of column planes include one or more errors, and communicating, by the memory device, a message that includes the third data formed by combining the first data and the second data.

Some examples of the method 700 and the apparatus described herein may further include operations, features, means, or instructions for generating, for each read operation performed, an indicator about whether one or more errors were identified during a respective read operation, where the message includes the indicator for each read operation. Some examples of the method 700 and the apparatus described herein may further include operations, features, means, or instructions for identifying that a first column plane of the first set of column planes or the second set of column planes includes an error based on the third data formed by combining the first data and the second data and the indicators about whether the one or more may be associated with respective read operations.

In some examples of the method 700 and the apparatus described herein, combining the first data with the second data may include operations, features, means, or instructions for identifying that a first bit of the first data at a first bit index may be a first value, identifying that a second bit of the second data at the first bit index may be the first value, and generating a value for the first bit index of the third data based on the first bit of the first data being the first value or the second bit of the second data being the first value. In some examples of the method 700 and the apparatus described herein, generating the indicators further may include operations, features, means, or instructions for setting a value of a third bit to indicate whether the one or more errors may be associated with the first read operation, and setting a value of a fourth bit to indicate whether the one or more errors may be associated with the second read operation.

Some examples of the method 700 and the apparatus described herein may further include operations, features, means, or instructions for identifying a collision associated with the first data and the second data based on the value of the first bit, the second bit, the third bit, and the fourth bit, and performing a single repair operation on the first set of column planes, the second set of column planes, or both based on identifying the collision associated with the first data and the second data. Some examples of the method 700 and the apparatus described herein may further include operations, features, means, or instructions for determining an address of a column plane associated with the one or more errors based on communicating the message, and repairing the column plane at the address based on determining the address.

Some examples of the method 700 and the apparatus described herein may further include operations, features, means, or instructions for storing the first data and the second data to a first register, where combining the first data with the second data occurs at the first register, and transferring the third data to a second register different than the first register, where the third data may be communicated from the second register. Some examples of the method 700 and the apparatus described herein may further include operations, features, means, or instructions for receiving a read-out command, where communicating the message may be based on receiving the read-out command.

Some examples of the method 700 and the apparatus described herein may further include operations, features, means, or instructions for identifying one or more banks for the first read operation and one or more banks for the second read operation according to a bank interleave pattern operable to reduce a likelihood of errors occurring for similar bit indexes values of the first data and the second data, where generating the first data and the second data may be based on identifying the one or more banks for the first read operation and the second read operation. In some examples of the method 700 and the apparatus described herein, the first data read from a first column of memory cells and the second data read from a second column of memory cells includes compressed data.

It should be noted that the methods described above describe possible implementations, and that the operations and the steps may be rearranged or otherwise modified and that other implementations are possible. Furthermore, portions from two or more of the methods may be combined.

An apparatus is described. The apparatus may include a memory array including a first set of column planes and a second set of column planes, a tester coupled with the memory array and the tester configured to cause the apparatus to, generate second data to identify one or more errors associated with memory cells of the second set of column planes, combine the first data with the second data into a third data that includes a set of indicators about whether the first set of column planes and the second set of column planes include one or more errors, and communicate a message that includes the third data formed by combining the first data and the second data.

Some examples may further include generating, for each read operation performed, an indicator about whether one or more errors were identified during a respective read operation, and identify that a first column plane of the first set of column planes or the second set of column planes includes an error based on the indicator. Some examples may further include generating a value for a first bit index of the third data based on a first bit of the first data being a first value or a second bit of the second data being the first value.

Some examples may further include identifying a collision associated with the first data and the second data based on a value of a bit associated with the respective data, and perform a single repair operation on the first set of column planes, the second set of column planes, or both based on identifying the collision associated with the first data and the second data. In some examples, the first data includes a first set of indicators about whether each column plane of the first set of column planes includes the one or more errors, and the second data includes a second set of indicators about whether each column plane of the second set of column planes includes the one or more errors.

An apparatus is described. The apparatus may include a memory array including a set of memory cells, the set of memory cells including a first set of column planes and a second set of column planes, a data generation component configured to generate first data to identify one or more errors associated with the first set of column planes and second data to identify one or more errors associated with the second set of column planes, a data combining component configured to combine the first data with the second data into third data that includes a set of indicators about whether the first set of column planes and the second set of column planes include one or more errors, and a transmission component configured to transmit a message that includes the third data formed by combining the first data and the second data.

Some examples of the apparatus may include an error identification component configured to generate, for a read operation performed, an indicator about whether one or more errors were identified during a respective read operation. In some examples, the error identification component may be configured to identify that a first column plane of the first set of column planes or the second set of column planes includes an error based on the indicator. Some examples of the apparatus may include a repair analyzer configured to perform a single repair operation on the first set of column planes, the second set of column planes, or both based on identifying a collision associated with the first data and the second data.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are signals), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
   generating, using a first read operation, first data to identify one or more errors associated with memory cells of a first plurality of column planes of a memory device, the first data comprising a first plurality of indicators about whether each column plane of the first plurality of column planes includes the one or more errors;
   generating, using a second read operation, second data to identify one or more errors associated with memory cells of a second plurality of column planes of the memory device, the second data comprising a second plurality of indicators about whether each column plane of the second plurality of column planes includes the one or more errors;
   combining the first data and the second data, by oring bits of the first data with bits of the second data, into a third data that comprises a third plurality of indicators about whether the first plurality of column planes and the second plurality of column planes include one or more errors; and
   communicating, by the memory device, a message that includes the third data formed by combining the first data and the second data.

2. The method of claim 1, further comprising:
   generating, for each read operation performed, an indicator about whether one or more errors were identified during a respective read operation, wherein the message includes the indicator for each read operation.

3. The method of claim 2, further comprising:
   identifying that a first column plane of the first plurality of column planes or the second plurality of column planes includes an error based at least in part on the third data formed by combining the first data and the second data and the indicators about whether the one or more errors are associated with respective read operations.

4. The method of claim 2, wherein combining the first data with the second data comprises:
   identifying that a first bit of the first data at a first bit index is a first value;
   identifying that a second bit of the second data at the first bit index is the first value; and
   generating a value for the first bit index of the third data based at least in part on the first bit of the first data being the first value or the second bit of the second data being the first value.

5. The method of claim 4, wherein generating the indicators further comprises:
   setting a value of a third bit to indicate whether the one or more errors are associated with the first read operation; and
   setting a value of a fourth bit to indicate whether the one or more errors are associated with the second read operation.

6. The method of claim 5, further comprising:
   identifying a collision associated with the first data and the second data based at least in part on the value of the first bit, the second bit, the third bit, and the fourth bit; and performing a single repair operation on the first plurality of column planes, the second plurality of column planes, or both based at least in part on identifying the collision associated with the first data and the second data.

7. The method of claim 1, further comprising:
determining an address of a column plane associated with the one or more errors based at least in part on communicating the message; and
repairing the column plane at the address based at least in part on determining the address.

8. The method of claim 1, further comprising:
storing the first data and the second data to a first register, wherein combining the first data with the second data occurs at the first register; and
transferring the third data to a second register different than the first register, wherein the third data is communicated from the second register.

9. The method of claim 1, further comprising:
receiving a read-out command, wherein communicating the message is based at least in part on receiving the read-out command.

10. The method of claim 1, further comprising:
identifying one or more banks for the first read operation and one or more banks for the second read operation according to a bank interleave pattern operable to reduce a likelihood of errors occurring for similar bit indexes values of the first data and the second data, wherein generating the first data and the second data is based at least in part on identifying the one or more banks for the first read operation and the second read operation.

11. The method of claim 1, wherein the first data read from a first column of memory cells and the second data read from a second column of memory cells comprises compressed data.

12. An apparatus, comprising:
a memory array comprising a first plurality of column planes and a second plurality of column planes; and
a tester coupled with the memory array and the tester configured to cause the apparatus to:
generate first data to identify one or more errors associated with memory cells of the first plurality of column planes;
generate second data to identify one or more errors associated with memory cells of the second plurality of column planes of the memory array;
combine the first data and the second data, by oring bits of the first data with bits of the second data, into third data that comprises a third plurality of indicators about whether the first plurality of column planes and the second plurality of column planes include one or more errors; and
communicate a message that includes the third data formed by combining the first data and the second data.

13. The apparatus of claim 12, wherein the tester is operable to cause the apparatus to:
generate, for each read operation performed, an indicator about whether one or more errors were identified during a respective read operation; and
identify that a first column plane of the first plurality of column planes or the second plurality of column planes includes an error based at least in part on the indicator.

14. The apparatus of claim 12, wherein the tester is operable to cause the apparatus to:
generate a value for a first bit index of the third data based at least in part on a first bit of the first data being a first value or a second bit of the second data being the first value.

15. The apparatus of claim 12, wherein the tester is operable to cause the apparatus to:
identify a collision associated with the first data and the second data based at least in part on a value of a bit associated with the respective data; and
perform a single repair operation on the first plurality of column planes, the second plurality of column planes, or both based at least in part on identifying the collision associated with the first data and the second data.

16. The apparatus of claim 12, wherein:
the first data comprises a first plurality of indicators about whether each column plane of the first plurality of column planes includes the one or more errors; and
the second data comprises a second plurality of indicators about whether each column plane of the second plurality of column planes includes the one or more errors.

17. An apparatus, comprising:
a memory array comprising a plurality of memory cells, the plurality of memory cells comprising a first plurality of column planes and a second plurality of column planes;
a data generation component configured to generate first data to identify one or more errors associated with the first plurality of column planes and second data to identify one or more errors associated with the second plurality of column planes;
a data combining component configured to combine the first data with the second data, by wino bits of the first data with bits of the second data, into third data that comprises a plurality of indicators about whether the first plurality of column planes and the second plurality of column planes include one or more errors; and
a transmission component configured to transmit a message that includes the third data formed by combining the first data and the second data.

18. The apparatus of claim 17, further comprising:
an error identification component configured to generate, for a read operation performed, an indicator about whether one or more errors were identified during a respective read operation.

19. The apparatus of claim 18, wherein the error identification component is configured to identify that a first column plane of the first plurality of column planes or the second plurality of column planes includes an error based at least in part on the indicator.

20. The apparatus of claim 17, further comprising:
a repair analyzer configured to perform a single repair operation on the first plurality of column planes, the second plurality of column planes, or both based at least in part on identifying a collision associated with the first data and the second data.

* * * * *